US005621433A

United States Patent [19]

Acksteiner

[11] Patent Number: 5,621,433

[45] Date of Patent: Apr. 15, 1997

[54] LOW-COST MULTICHANNEL OSCILLISCOPE FOR TEACHING AND DEMONSTRATION PURPOSES

[76] Inventor: Fritz Acksteiner, Judenberg 2, 86150 Augsburg, Germany

[21] Appl. No.: 311,427

[22] Filed: Sep. 23, 1994

Related U.S. Application Data

[63] Continuation-in-part of Ser. No. 155,455, Nov. 19, 1993, abandoned.

[30] Foreign Application Priority Data

Nov. 19, 1992 [DE] Germany .......................... 42 39 027.3

[51] Int. Cl.[6] .......................................... G09G 5/36

[52] U.S. Cl. ......................................... 345/134; 324/121 R

[58] Field of Search ................................ 345/134, 133, 345/10; 324/121 R

[56] References Cited

U.S. PATENT DOCUMENTS 4,250,503 2/1981 Shanks .................................... 345/134

4,257,043 3/1981 Tsuchiko ................................ 345/134

FOREIGN PATENT DOCUMENTS 4132312 1/1993 Germany .

*Primary Examiner*—Mark R. Powell

*Assistant Examiner*—Matthew Luu

*Attorney, Agent, or Firm*—Michael J. Striker

[57] ABSTRACT

The multichannel oscilloscope has a dot matrix display device, advantageously an LCD, with an integrated controller and character generator for forming a display made up of a plurality of characters consisting of pixels on a display screen, a multiplexer device connected to receive data from a plurality of channels and send the data to the dot matrix display device for multichannel display purposes and an additional controller device for controlling the transmission of the data from the multiplexer to the dot matrix display device and for controlling the parameters of the display device. The additional controller device consists of two EPROM units only and a more expensive but versatile microprocessor chip is not necessary. The additional controller device alternately transmits instruction signals defining a position on the display screen and input data signals from the multiplexer device determining a character to be displayed at that position. In one embodiment digital signals that alternate between two values in a plurality of channels can be simultaneously displayed, while in another embodiment the time dependence of varying analog input data signals in a plurality of channels can be displayed.

9 Claims, 6 Drawing Sheets

DATA BUS SIGNAL

| | $\overline{CS1}$ | $\overline{CS2}$ | D/I | DB7 | DB6 | DB5 | DB4 | DB3 | DB2 | DB1 | DB0 |
|---|---|---|---|---|---|---|---|---|---|---|---|
| X-PAGE | 0 | 1 | 0 | 1 | 0 | 1 | 1 | 1 | 0 | 0 | 0 |
| Y-ADDRESS | 0 | 1 | 0 | 0 | 1 | 1 | 1 | 1 | 1 | 1 | 1 |
| DATA | 0 | 1 | 1 | 1 | 1 | 1 | 1 | 1 | 1 | 1 | 1 |

ONE BLACK LINE IN THE MIDDLE OF PAGE 0

DATA BUS SIGNAL

| | $\overline{CS1}$ | $\overline{CS2}$ | D/I | DB7 | DB6 | DB5 | DB4 | DB3 | DB2 | DB1 | DB0 |
|---|---|---|---|---|---|---|---|---|---|---|---|
| X-PAGE | 1 | 0 | 0 | 1 | 0 | 1 | 1 | 1 | 1 | 1 | 1 |
| Y-ADDRESS | 1 | 0 | 0 | 0 | 1 | 1 | 1 | 1 | 1 | 1 | 1 |
| DATA | 1 | 0 | 1 | 1 | 0 | 0 | 0 | 0 | 0 | 0 | 0 |

ONE BLACK DOT AT LOWER RIGHT CORNER

Z
0
1
2
3
4
5
6
7
3
3"
LCD
3'
8 PIXEL
27
19
ADDITIONAL DECODER AND MULTIPLEXER
ADDITIONAL CONTROL UNIT 20
20
14
EPROM
EPROM
24
18
SRAM
22
ADDRESS COUNTER
50
25
17
A
D
≥0
NOR-GATE 40
MULTIPLEXER 21
CLOCK 6
TRIGGER
ANALOG MULTIPLEXER 16
ADDITIONAL SCHMITT TRIGGER 23
U
I

LOW-COST MULTICHANNEL OSCILLISCOPE FOR TEACHING AND DEMONSTRATION PURPOSES

BACKGROUND OF THE INVENTION

This is a continuation-in-part of U.S. patent application Ser. No. 08/155,455, filed Nov. 19, 1993, now abandoned.

The present invention relates to multichannel oscilloscopes for teaching and demonstration purposes and, more particularly, to multichannel oscilloscopes based on a liquid crystal display (LCD) device.

U.S. Pat. No. 4,257,043 issued to M. Tsuchiko, Mar. 17, 1981 describes a multichannel oscilloscope for storage and display of a plurality of analog input signals. This multichannel oscilloscope comprises a CRT display device with horizontal sweep generator, a multiplexer, an analog-to-digital converter connected to digitize incoming signals from the multiplexer and digital memory units to store the incoming digitized signals as well as a digital-to-analog converter to convert the digital signals from the memory into analog signals for the CRT display device. This multichannel oscilloscope has an additional controller unit for synchronous control of the multiplexer and memory units so that separate incoming signals are routed to separate memory units. Although the CRT device can provide a comparatively rapid response time to an incoming signal, this multichannel oscilloscope device is comparatively expensive and complex for use by individual students for instructional and demonstration purposes.

U.S. Pat. No. 4,690,509 issued to W. Bohmer on Sep. 1, 1987 describes a single-channel or input oscilloscope device based on a liquid crystal display (LCD) or dot matrix picture screen device which can be operated by battery power and which includes extra display means for a frequency counter and a digital voltmeter. The basic slow response time of the LCD is overcome by using an analog multiplexer to scan the LCD screen device. This type of oscilloscope has the advantage of both very low power consumption and voltage threshold.

A low-cost battery-powered multichannel oscilloscope would be highly desire for teaching purposes, because it would allow individual testing of electronic circuitry by each student in a scientific or engineering course. The basic components of a multichannel LCD oscilloscope of this type are currently available commercially but this type of multichannel oscilloscope is not currently available and has not been previously made.

Oscilloscopes currently have been used as component parts of an instruction system in various applications, for example as described in German Patent Application P 41 32 312.2.

SUMMARY OF THE INVENTION

It is an object of the present invention to provide a low-cost multichannel oscilloscope for teaching and demonstration purposes.

It is also an object of the present invention to provide a low-cost multichannel oscilloscope for teaching and demonstration purposes based on a mass-produced low-cost LCD or dot matrix display device having an integrated controller and character generator which are currently only used for alphanumeric display purposes.

According to the invention the multichannel oscilloscope comprises a dot matrix display device with an integrated controller and character generator for forming a display comprising a plurality of characters consisting of pixels on a display screen, a multiplexer device connected to receive data from a plurality of channels and send the data to the dot matrix display device for multichannel display purposes and additional controller means for controlling the transmission of the data from the multiplexer to the dot matrix display device and for controlling the parameters for display of the pixels on the dot matrix display device. The additional controller means consists of two read-only-memory units, advantageously EPROM units, only and a more expensive but versatile microprocessor chip is not necessary.

In a preferred embodiment the dot matrix display device is a liquid crystal display (LCD) device with integrated controller. These devices are now mass-produced, low-cost and widely available. Examples of suitable LCD displays are LCD displays manufactured by Densitron International with built-in controller units, for example made by Hitachi, for controlling the display of the pixels and generating the characters made from the pixels on the display screen. Examples include the LMH4328 and LMH3328 model series of DENSITRON which incorporates a Hitachi HD61202 controller. These LCD devices are available at the comparatively low price of about $50 and are widely used for alphanumeric and graphic purposes, but have a comparatively slow response time in comparison to CRT display devices.

It is characteristic for all these digital displays that they provide a 1 to 16 bit digital interface by which instructions for control of the display device and for forming the character patterns built from pixels are transmitted to the display device. In contrast to building a state of the art oscilloscope the electrical input signals must be transformed into digital signals only. These digital signals are fed into the databus of the display device used in the invention and generate the desired screen pattern according to a character code built into the character generator. This process must be repeated for all the locations where data is displayed on the screen so that there are limitations on the speed of the low-cost multichannel oscilloscope according to the invention. These speed limitations arise because the pixels are not addressed by only applying voltage in an x and y direction in a manner similar to a CRT device, but instead the address must be provided as a serial address composed of a plurality of bits or several 8 or 16 bit digital characters. Furthermore to produce the pixel requires a certain internal processing time in the LCD display device which can amount to several microseconds. The advantage of using the LCD with integrated controller is however that one can utilize any of a large number of characters available in the character generator when displaying an input signal. For example several sinusoidal curves could be shown with several different characters, including dots, Xs and dashes simultaneously. Also multichannel mode and storage oscilloscope features are very easy to incorporate in the multichannel oscilloscope of the invention. This latter feature is very important for demonstration and teaching purposes. Thus for example instead of printing lines it is possible to print "0" and "1" in the case of a digital embodiment of the multichannel oscilloscope according to the invention or to

TABLE 1

Internal Character Generator Patterns and Character Codes

Higher & bit

| Lower & bit | 0010 | 0011 | 0100 | 0101 | 0110 | 0111 | 1010 | 1011 | 1100 | 1101 | 1110 | 1111 |
|---|---|---|---|---|---|---|---|---|---|---|---|---|
| xxxx0000 | | | | | | | | | | | | |
| xxxx0001 | | | | | | | | | | | | |
| xxxx0010 | | | | | | | | | | | | |
| xxxx0011 | | | | | | | | | | | | |
| xxxx0100 | | | | | | | | | | | | |
| xxxx0101 | | | | | | | | | | | | |
| xxxx0110 | | | | | | | | | | | | |
| xxxx0111 | | | | | | | | | | | | |
| xxxx1000 | | | | | | | | | | | | |
| xxxx1001 | | | | | | | | | | | | |

TABLE 1-continued

| | | | | | | | | | | | | |
|---|---|---|---|---|---|---|---|---|---|---|---|---|
| xxxx1010 | | | | | | | | | | | | |
| xxxx1011 | | | | | | | | | | | | |
| xxxx1100 | | | | | | | | | | | | |
| xxxx1101 | | | | | | | | | | | | |
| xxxx1110 | | | | | | | | | | | | |
| xxxx1111 | | | | | | | | | | | | |

print maximum voltage in numbers on the screen without having the use and additional digital display circuit which is necessary in the oscilloscope device as described in the Bohmer prior art reference mentioned above. Table 1 provides an example of the large number of pixel-formed characters available from the HD 61830B controller of Hitachi.

Another advantage of the display according to the invention is that, when an image is displayed on the LCD screen, it is stored automatically by its internal control unit unless a "clear screen" command is input to the integrated controller. Thus the multichannel oscilloscope according to the invention automatically provides the features of a storage oscilloscope.

The simplest form of the multichannel oscilloscope according to the invention is a digital oscilloscope. In this embodiment the logical "0" and "1" signals from the circuits to be tested can be used as direct input signals for the databus of the display without an A/D converter. Using the HD 61830B controller the obvious choices for display of digital signals are (1) as a graphic line signal, i.e. a series of square wave pulses, or (2) by directly writing 0 and 1 in series as alphanumeric characters on the display screen. In the latter case the logical signal "low" would be encoded as an 8 bit character "00110000" and the logical signal "high" as "00110001" in the case of the HD 61830B controller whose character codes are shown in Table 1.

The fact that the available LCD or "smart" displays have a built-in controller leads to the simplification that an additional microprocessor is usually not necessary for the multichannel oscilloscope according to the invention, but instead the instructions for the display can be stored in one or two external EPROMs or ROMs. The EPROMs or ROMs in the multichannel oscilloscope according to the invention are connected and structured so that signals from the circuits being tested or input signals also enter the data bus of the display.

For analog applications, i.e. for displaying the form of input signals such as sinusoidal input signals, only one external A/D converter is necessary to generate the x and y address for the display databus. The character to be displayed in this case would then be a simple dot or for instance a "V" and "I" indicating voltage and current curves respectively. Of course if a multicolor display is available, the curves may also be in different colors.

BRIEF DESCRIPTION OF THE DRAWING

The objects, features and advantages of the present invention will now be illustrated in more detail by the following detailed description, reference being made to the accompanying drawing in which.

DESCRIPTION OF THE PREFERRED EMBODIMENTS

Figure 1:
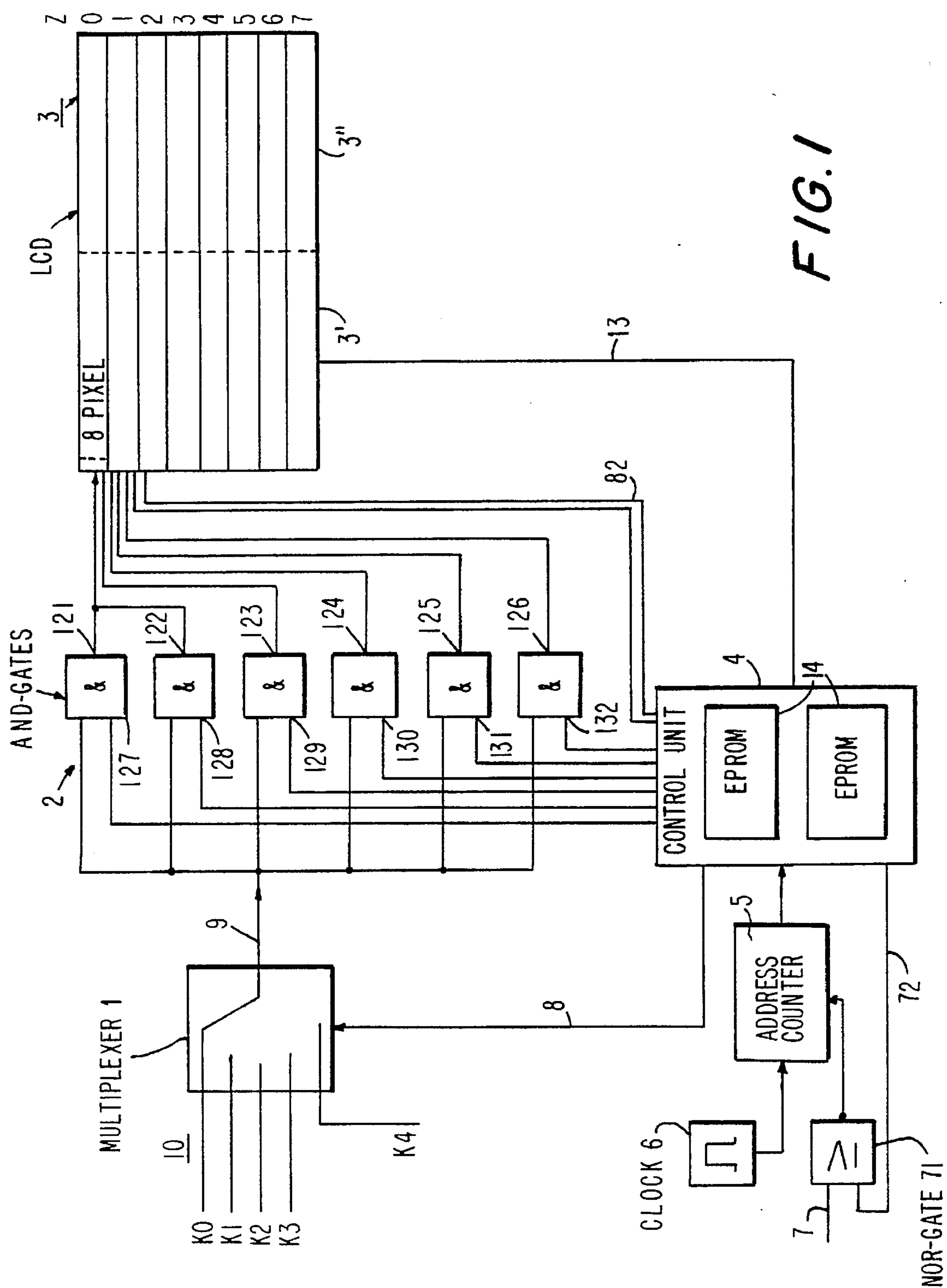
FIG. 1 is a block diagram of a digital embodiment of the multichannel oscilloscope according to the present invention.

The multichannel oscilloscopes according to the invention shown in FIGS. 1 and 6 each include an LCD device 3 with integrated controller and an additional control unit 4,20 including two EPROMs 14 which drive the control and address inputs of the LCD display 3 using a suitable program, an example of which is shown and described hereinbelow. The n input signals of the n input channels (in the embodiment of FIG. 1 channels K0 to K3) are fed via an n-channel multiplexer 1, 16 to the LCD device 3 and are fed to the LCD display via the AND-gate 2. Of course the additional control unit 4,20 including an address counter could be a microprocessor but that would result in a greater cost for the multichannel oscilloscope.

A clock device 6 generates clock pulses which indirectly control the execution of the program in the EPROMs of the preferred embodiment. If the clock is interrupted and simultaneously the inputs are locked, the current image is frozen on the LCD display. This provides an extremely simple method of storage of the oscillogram.

A trigger circuit means, in the present embodiments, a NOR-gate 71,40, continuously ensures that the image is stationary, i.e. the same start.

Figure 2:
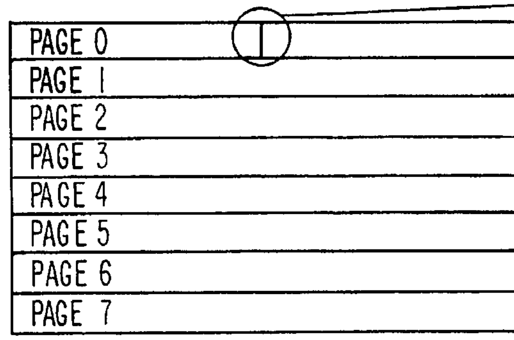
FIG. 2 shows two examples of dot patterns and the data bus signals required to create them with the preferred LCD display device used in the oscilloscope of FIG. 1.
Figure 2:
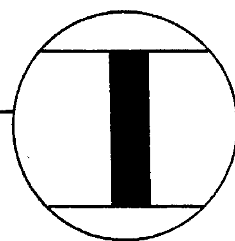
Figure 2:
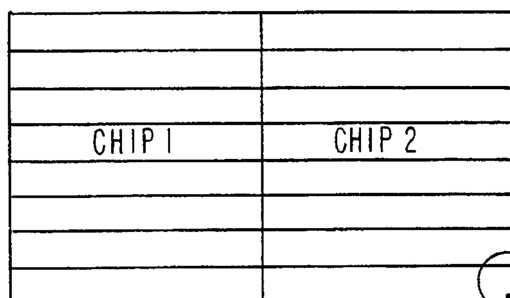
Figure 2:
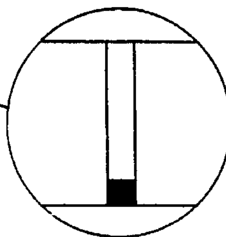

The dot matrix display means of the invention in both embodiments is an LCD display device with integrated controller. The display device which is preferred is an LMH4328 made by DENSITRON INTERNATIONAL with an integrated controller HD61202 from Hitachi. Some of the instructions codes 9 for the Hitachi controller are given on Table 2. The LMH4328 includes two 64×64 pixel screens 3', 3" placed side-by-side which are separately addressed by setting the $\overline{CS1}$ and $\overline{CS2}$ pins on the display data bus "low" so that the composite screen is a 64×128 dots display screen. The horizontal direction on the screen is designated as the Y axis or direction and the vertical direction is designated as the X axis or direction. The X axis is divided into 8 pages each containing 8 dots in the vertical direction and 128 dots along the Y direction. In FIG. 1 the pages on LCD display 3 are indicated as Z0, Z1, . . . , Z7. Each page consists of 128×8 pixels. To set one pixel within a certain page on the screen of the LCD display device 3 the following instruction sequence must be performed:

1. Display on, define zero page,
2. Clear display screen,
3. Set page (X-address),
4. Set Y-address (includes $\overline{CS1}$ or $\overline{CS2}$).
5. Write display data (setting one of the 8 pixels within a page) by setting one of the data bits DB0 . . . DB7 of the display data bus "high". For example writing 10101010 in the display data bus during step 5 prints 4 black dots separated by blanks in the addressed page at the given Y-address. FIG. 2 provides two examples of addressing and printing pixel patterns using the specific code of the HD61202 LCD controller. If other controllers are used in the LCD display device, different addressing schemes may be used. In one different type of addressing scheme the pixel address is given as a single digit number and the pixel in the upper left corner of the display screen has the address 0 and the pixel on the lower right corner has the address 64×128 (when the LMH4328 is used). The address may be input in a serial mode. Differences in addressing may be accounted for by changing the EPROM program in the control unit and the wiring of the EPROM databus.

Figure 3:
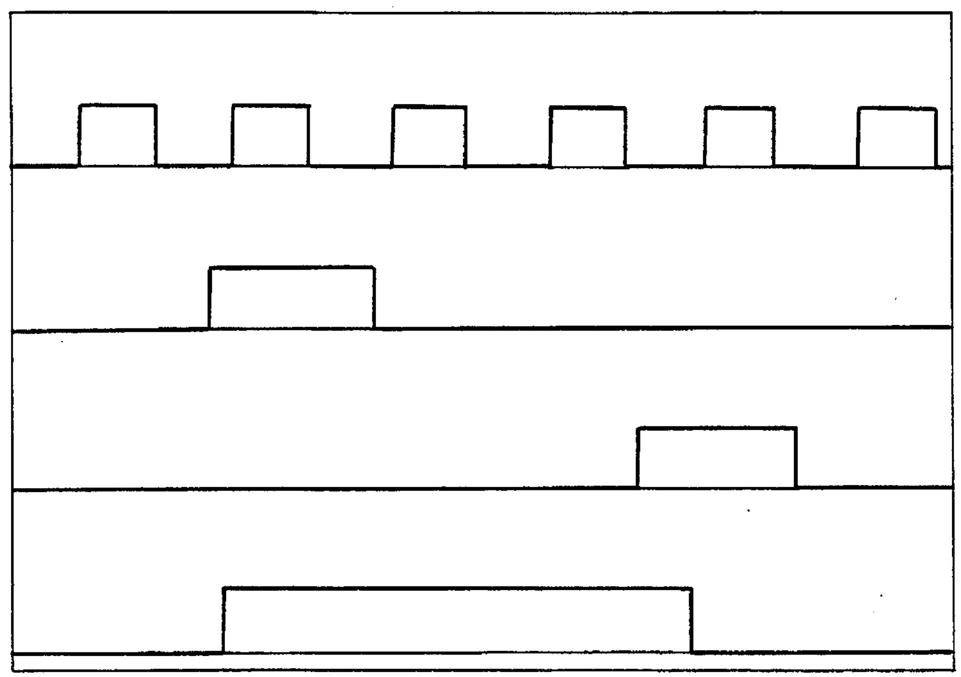
FIG. 3 is a photographs of an oscillogram of 4 digital signals produced with a 4 channel oscilloscope shown in FIG. 1.
Figure 3:
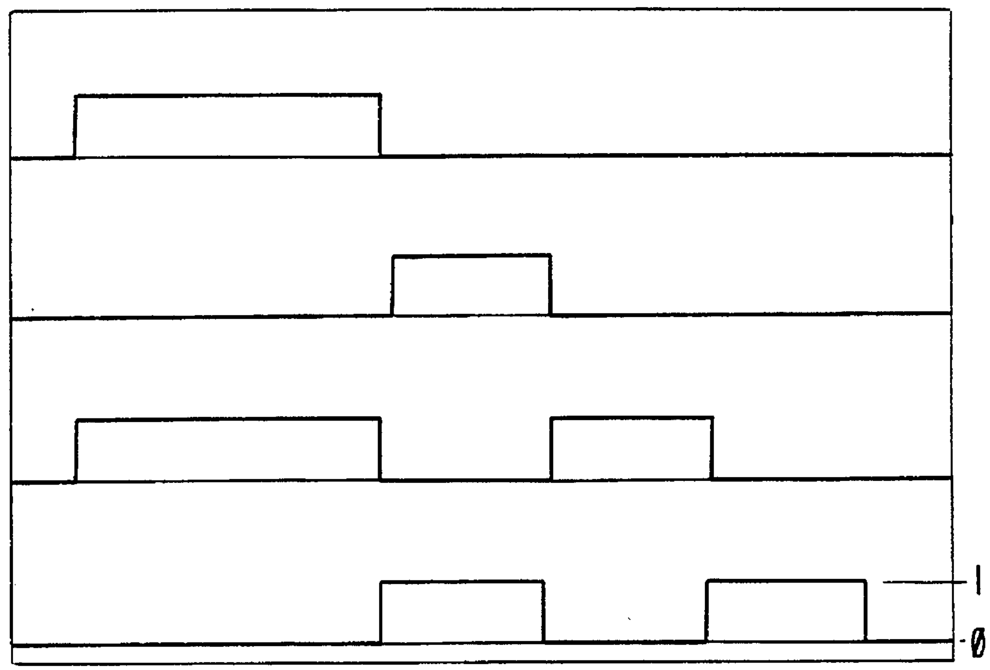

Single dots are usually printed in the so-called graphic mode of the controller. In the alphanumeric mode at a specified address the code for a certain character has to be fed to the data bus. Since characters normally consist of several pixels there is a certain loss of resolution if the character mode is used to display signals which occurs along the time axis or the Y axis in a digital oscilloscope. In the case of the LCD display used in the multichannel oscilloscope described here a graphic mode is used. FIG. 3 shows a photograph of a type digital 4-channel oscillogram. Every

TABLE 2

Instructions for HD01202

| | | Code | | | | | | | | | | |
|---|---|---|---|---|---|---|---|---|---|---|---|---|
| | Instructions | R/W | D/I | DB7 | DB6 | DB5 | DB4 | DB3 | DB2 | DB1 | DB0 | Functions |
| 1 | Display ON/OFF | 0 | 0 | 0 | 0 | 1 | 1 | 1 | 1 | 1 | 1/0 | Controls the ON/OFF of display. RAM data and internal status are not affected. 1: ON, 0: OFF. |
| 2 | Display start line | 0 | 0 | 1 | 1 | | display start line (0~63) | | | | | Specifies a RAM line displayed at the top of the screen |
| 3 | Set page (X address) | 0 | 0 | 1 | 0 | 1 | 1 | 1 | | Page (0~7) | | Sets the page (X address) of RAM at the page (X address) register. |
| 4 | Set Address | 0 | 0 | 0 | 1 | | Y address (0~63) | | | | | Sets the Y address at the Y address counter |
| 5 | Status Read | 1 | 0 | Busy | 0 | ON/OFF | RESET | 0 | 0 | 0 | 0 | Reads the status. RESET 1: reset 0: normal; ON/OFF 1: display OFF 0: display ON; Busy 1: on the internal operation 0: Ready |
| 6 | Write deisplay data | 0 | 1 | | | | Write Data | | | | | Writes data DB0 (LSB) to DB7 (MSB) on the data bus into display RAM. Has access to the address of the display RAM specified in advance. After the access, Y address is increased by 1. |
| 7 | Read display data | 1 | 1 | | | | Read Data | | | | | Reads data DB0 (LSB) to DB7 (MSB) from the display RAM to the data bus. |

Note 1) Busy time varies with the frequency ($f_{CLK}$) of $\phi 1$, and $\phi 2$.
($1/f_{CLK} \leqq T_{BUSY} \leqq 3/f_{CLK}$)

other page is written as zero in the 4-channel embodiment shown so that inputs from each of the 4 channels are shown in the oscillogram. In each page showing a channel signal the "0" line is printed as two dots at the bottom of that page and the "1" is printed as 8 vertical dots.

In the digital embodiment shown in FIG. 1 the output of the NOR-gate 71 is fed to the address counter 5 for the EPROM program in controller 4. The clock 6 also is connected to feed clock pulses to the address counter 5 to time the generation of addresses. In this embodiment six AND-gate elements of the AND-gate 2 are provided. A somewhat different structure is necessary in the analog embodiment.

Figure 4:
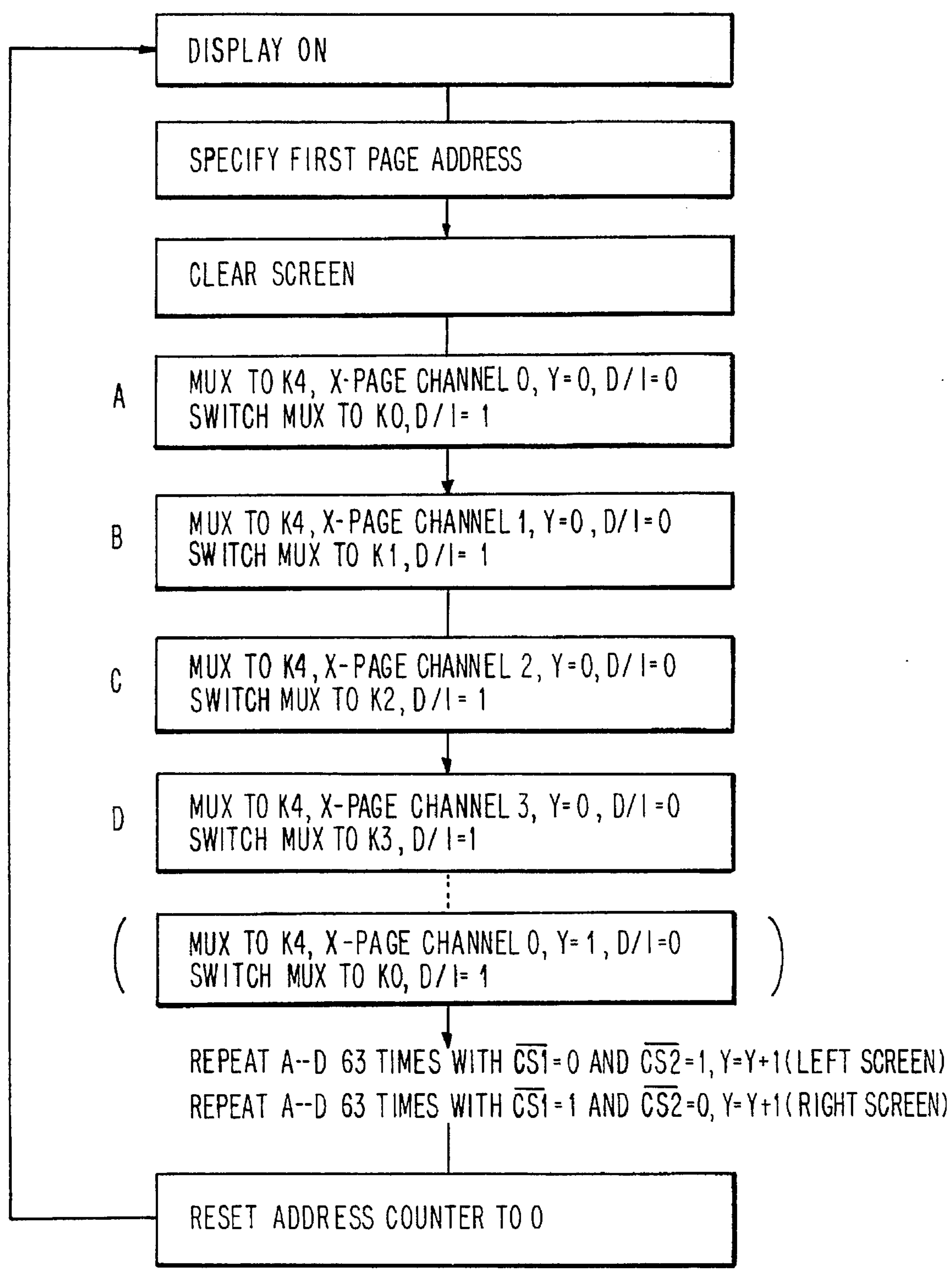
FIG. 4 is a block diagram of an EPROM program for controlling the multiplexer used in the EPROMs of the additional controller according to the invention.

The basic operation of the digital embodiment of the multichannel oscilloscope is best understood with the aid of FIGS. 1 and 4.

The two EPROMs 14 in the embodiment of FIG. 1 control a 16 bit data and instruction bus for the LCD and other components. Only 15 bits are need to the LMH4328 in the case of the digital embodiment. Data bit 0 to 7 of the EPROM1 are used to drive the data bus of the LCD. Databit 0 to 6 of EPROM2 carry the data signals D/I, CS1, CS2 (on line 13 in FIG. 1), COUNTER RESET (on line 72) and MULTIPLEX CHANNEL SELECTION (on line 8). The oscilloscope is triggered by setting input 7 of the NOR gate 71 to "1". This results in a zero at output of NOR gate 71, if line 72 carries a "0" which occurs in program step 0 in the EPROM program. The "0" at the output of NOR gate 71 enables the EPROM address counter and in the following program step 1 (see FIG. 4) of the EPROM 2 the COUNTER RESET signal is at "1" and remains in that state until all the instructions of the program are executed. The sequence of instructions are now transmitted to the display data bus as indicated in FIG. 4. This sequence consists of instructions and data. Instructions include specific addresses, commands to turn the display "on", and switching commands for switching from graphic to numeric mode. Data include commands to set pixels or characters. The signal "D/I" indicates whether the associated bits are an instruction or data. If "D/I"=0, an instruction is being transmitted, while if "D/I"=1 data is being transmitted. The data originate from the external signal via channel K0, . . . K3 of the multiplexer 1 in the digital embodiment shown in FIG. 1. Instructions originate only in EPROM1 according to its internal program. The six AND-gate elements of the AND-gate 2 are used to select between Data and instructions in the manner of a multiplexer. The outputs 121,122, . . . , 126 of these AND-gate elements are directly connected to DB0, DB1, DB2, DB3 and DB5 of the display data bus. If all 8 vertical pixels within one page could be effected by changes in data, either AND-gate elements would be necessary. But in the digital embodiment shown in FIG. 1, the zero line of a channel is displayed as the two lower dots of each page, so the lower two dots DB6 and DB7 are always written over lines 82 whether the input signal is "0" or "1"(see FIG. 3). The two lower dots of all channels are thus directly written by the program in EPROM1.

The outputs of the AND-gate elements 121,122, . . . , 126 vary according to one of the channel signals K0 . . . K3 fed to the AND-gate elements on line 9 if the other inputs 127,128, . . . , 132 from the EPROMs are at "1" or "high". The other inputs 127,128, . . . , 132 are automatically set to "1" during the data portion of each EPROM program step. The outputs of the AND-gate elements 121,122, . . . , 126 follow the instructions from the EPROM if the input 9 is held on "1". This is during the instruction section of each EPROM program step by switching the multiplexer output 9 to "1" on the line K4. After setting all 8 pages and 128 y-addresses according to the program in FIG. 4. One example of an oscillogram formed in this way is shown in FIG. 3. The oscillogram is automatically stored by the LCD device until the next sequence of program instructions is started at the EPROM address 0. To reach this address the address counter 5 in FIG. 1 must be set back to 0. This is done by setting the EPROM "counter rest" signal over line 72 in FIG. 1 to "0" for a series of dummy instructions. When the trigger signal over input line 7 in FIG. 1 makes a transition from "1" to "0" or is already at "0" the address counter is set to zero (NOR gate output="1"). The program starts again when the trigger signal 7 makes a transition from "0" to "1".

The LMH4328 LCD with the integrated controller provide a means for storing the displayed oscillogram for any desired length of time by simply setting an enable signal sometimes called "E" or "CE" on the data bus. If this input signal is present, the display device does not react to any instructions on its data bus. This "enable" signal thus provides a built-in start and stop function like those of a storage oscilloscope.

Figure 5:
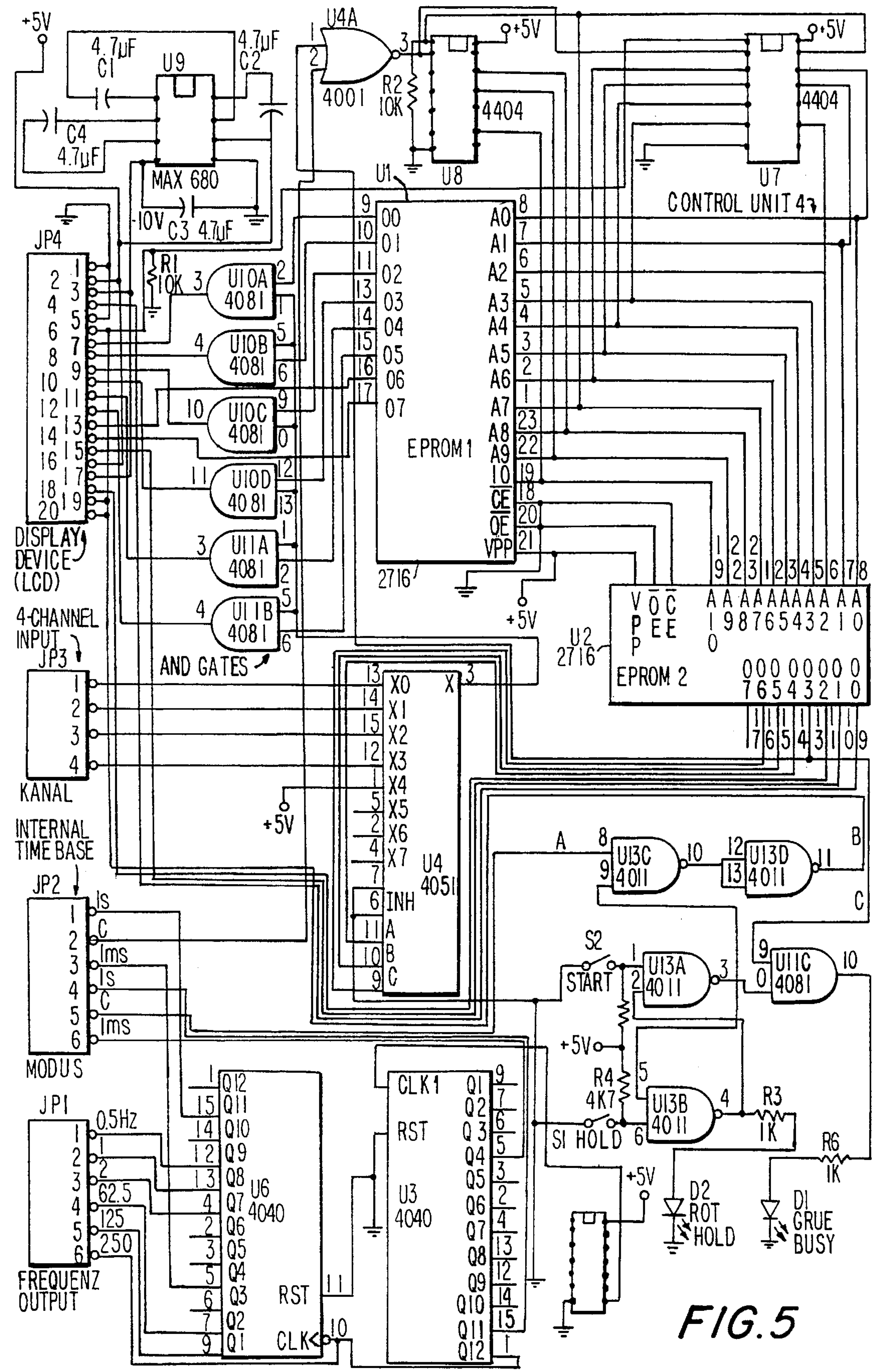
FIG. 5 is a circuit diagram of a preferred embodiment of the multichannel oscilloscope shown in FIG. 1 with pin numbers showing connections.

A detailed circuit diagram of one example of a 4-channel digital embodiment of the multichannel oscilloscope according to the invention as shown in FIG. 1 is shown in FIG. 5. This embodiment is built from standard CMOS circuits and has a frequency range from 0 to about 10 Khz. The price for the CMOS circuits and display device is less than $100. The start and store function is simply realized by a flip flop built from two NAND-gates U13A and U13B. The output of the flip flop is gated in U13C with the trigger from JP2 so as to ensure that the oscilloscope always starts in a synchronous manner.

Figure 6:
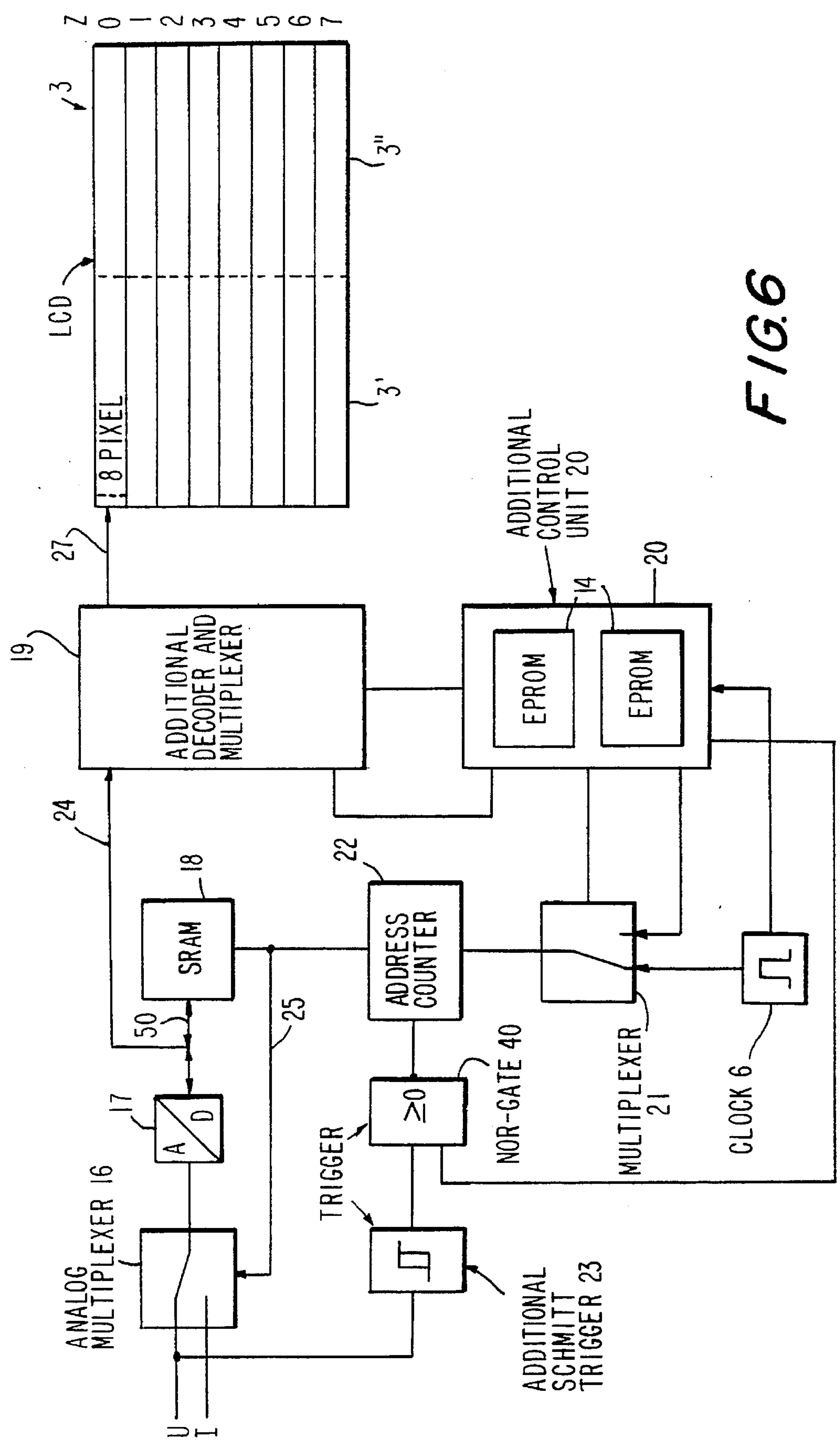
FIG. 6 is a block diagram of an analog embodiment of the multichannel oscilloscope according to the present invention.

The structure of an analog embodiment of the multichannel oscilloscope according to the invention is shown in FIG. 6. An analog multiplexer 16 which is switched between two input signals U,I (e.g. voltage and current) is provided in this embodiment as well as an A/D converter 23. To store or display successively occurring U,I values the multiplexer 16 is switched between the U,I inputs with the least significant bit of the address counter 22. To allow for higher resolution in the vertical direction on the IMH4328, the addressing sequence is different from the above digital embodiment and requires an additional decoder and multiplexer unit 19. To increase the speed to several 100 Khz an additional SRAM 18 is necessary to store fast incoming digital signals which are then displayed by the relatively slow display device, the limiting frequency now being the conversion frequency of the A/D or the access time of the SRAM. To read data from the SRAM after measurement the multiplexer 21 can set the SRAM address counter not only by the clock generator 6, but also by the EPROM unit 13 so data flow is synchronous with EPROM instructions.

The trigger means 23, 40 now comprises an additional Schmitt trigger 23 connected to the NOR gate 40 so that the trigger level can be adjusted according to one of the analog signals, U,I.

For low frequency (<100 Hz) applications the internal delay time of the display device is negligible and the bi-directional data bus 50 of the SRAM is switched into a tristate mode so data coming from the A/D are transmitted directly to the decoder(multiplexer) 19 over the bus 24. The basic functions of the decoder or multiplexer 19 are as follows: The incoming analog data are converted by a typical A/D into an 8 bit digital signal. The LMH4328 provides a resolution of 64 pixels in the vertical direction; only the 6 higher bits are needed in this case. Unfortunately as described above addressing a pixel by simply giving X and Y addresses as two digital numbers is not very common in displays with integrated controllers, since their main purpose is to display characters and graphics. Thus depending on the individual data processing and addressing code of the LCD display device it is necessary to adjust the incoming signal. In the case of the LMH4328 of the preferred embodiment the Y-address (time axis) within one half the data screen can be defined as a 6 digit number (see Table 2). The vertical address, i.e. the X-address must be split into a page number and one of 8 pixels (Px) to be defined as data (see FIG. 2). The page number can be encoded from the 3 higher data bits D7, D6, D5 coming from the A/D or the SRAM. To define one pixel within a page an additional 1 out of 8 decoder is necessary in the multiplexer 19 (this is also basically a multiplexer type device with 1 input, 8 outputs and 3 addressing pins D4, D3, D2). The multiplexer 19 allows 3 different types of 8 bit signals to be switched to the 8 bit data bus of the display: DB7, DB6, DB5, DB4, DB3, DB2, DB1, DB0.

| | | | | | | | | |
|---|---|---|---|---|---|---|---|---|
| X-page address: | 1 | 0 | 1 | 1 | 1 | D7 | D6 | D5 |
| Pixel data Px: | 0 | 0 | 0 | 0 | 1 | 0 | 0 | 0 |
| Y-address | 0 | 1 | y5 | y4 | y3 | y2 | y1 | y0 |

(In the above sequence pixel #4 is set in the page defined by D7, D6, D5. To set pixel #4, D4=1, D3=0 and D2=0 is necessary).

For displaying the channels U,I as functions of time the Y-address is basically derived from the address counter of the EPROM. It is also possible to print U as a function of I or vice versa when D7, . . . D2 of D/A or SRAM are multiplexed into the display data bus as a Y-address when U(I) defines the vertical axes. This can easily be cone by presetting the address counter of the EPROMs so that the oscilloscope starts its cycle in a different program that defines Y via D7, . . . , D2. The oscilloscope can therefore also serve as curve tracer or more generally for displaying the signal on channel 1 as a function of the signal on channel 2. The latter is not possible in the state of the art oscilloscopes without external wiring.

The oscilloscope described is characterized by a simple and consequently low-price structure. There is however a comparatively low limit frequency for on-line operation, but that is of subordinate importance for instructional and teaching purposes. If the limit frequency is increased, the input data may be loaded to a high speed memory which is then interrogated with a frequency below the limit frequency of the oscilloscope.

While the invention has been illustrated and described as embodied in a low-cost multichannel oscilloscope, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims:

1. A multichannel oscilloscope comprising a dot matrix display device including a display screen having a plurality of positions for display of characters consisting of pixels and an integrated controller means and character generating means for forming a display image on the display screen made up of a plurality of said characters in response to input data signals containing character determining information and input instruction signals containing character position determining information, a multiplexer device having means for receiving data signals in any of a plurality of input channels and having means for selecting one of said input data signals for transmission to said integrated controller means of said dot matrix display device and additional controller means for controlling the transmission of the data from the multiplexer device to the dot matrix display device and for generating said input instruction signals for selecting said positions at which said characters are to be displayed, wherein the additional controller means consists of two read-only-memory devices containing means for generating said input instruction signals and means for controlling said multiplexer.

2. A multichannel oscilloscope as defined in claim 1, wherein said dot matrix display device is an LCD device containing said integrated controller means.

3. A multichannel oscilloscope as defined in claim 2, wherein said LCD device is an LMH4328 of Densitron International and said integrated controller means is an HD61202 integrated controller means of Hitachi and said display screen has 128×64 pixels including 8 pages arranged vertically one above the other, each of said pages containing 128×8 pixels.

4. A multichannel oscilloscope as defined in claim 2, wherein said read-only-memory devices each comprise a preprogrammed EPROM.

5. A multichannel oscilloscope as defined in claim 4, wherein said additional controller means includes means for clearing said display screen, means for sequentially transmitting horizontal position data signals and means for controlling said multiplexer to sequentially select ones of said input channels and to transmit ones of said input data signals from each of said input channels and vertical position instruction signals containing information characteristic of a vertical position at which said character derived from said input data signal is to be displayed for each of said horizontal position data signals.

6. A multichannel oscilloscope as defined in claim 1, further comprising a plurality of and-gate elements, each of said and-gate elements having an output at which one bit of a multibit data word is supplied to said integrated controller means of said display device and two inputs, one of said inputs being connected to an output of said multiplexer device to which said input data signals are channeled and another of said inputs being connected to said additional controller means to receive a control signal therefrom for enabling transmission of said multibit data word to said integrated controller means.

7. A multichannel oscilloscope as defined in claim 6, wherein said read-only-memory devices consist of two preprogrammed EPROMS and further comprising an address counter connected to said EPROMS to control sequential execution of instructions stored in said EPROMS, a clock device connected to said address counter and a trigger means connected to said counter for resetting and starting said programs including a NOR-gate having an output connected to an input of said address counter and two inputs, one of said inputs being connected to receive an external input and another of said inputs being connected to receive a status signal from said EPROMS.

8. A multichannel oscilloscope as defined in claim 1, further comprising an analog/digital converter connected between said multiplexer device and said integrated controller means of said display device for conversion of analog signals in said input channels into digital signals.

9. A multichannel oscilloscope as defined in claim 8, further comprising an input data memory storage means and a two-way digital data bus, said input data memory storage means being connected via said two-way digital data bus to an output of said analog/digital converter to receive digitized data from said analog/digital converter and to said integrated controller means of said display device via said two-way digital data bus, and means for controlling said multiplexer device and said input data memory storage means to collect sequential input data values from said input channels and store said input data values in said input data memory storage means for later display on said display screen.

* * * * *